United States Patent [19]

Rubow et al.

[11] Patent Number: 5,023,610

[45] Date of Patent: Jun. 11, 1991

[54] DATA COMPRESSION METHOD USING TEXTUAL SUBSTITUTION

[75] Inventors: Keith A. Rubow, Glendora; Robert D. Wachel, South Pasadena, both of Calif.

[73] Assignee: Cordell Manufacturing, Inc., Covina, Calif.

[21] Appl. No.: 537,502

[22] Filed: Jun. 13, 1990

[51] Int. Cl.[5] .................................... H03M 7/30
[52] U.S. Cl. ............................. 341/51; 341/87; 341/79; 364/200; 364/260.6; 375/122
[58] Field of Search .............. 341/51, 55, 60, 67, 341/79, 87, 95, 106; 364/200, 900, 260.6; 375/122

[56] References Cited

U.S. PATENT DOCUMENTS

| | | | |
|---|---|---|---|
| 3,237,170 | 2/1966 | Blasbalg et al. | 341/51 |
| 3,883,847 | 5/1975 | Frank | 364/900 |
| 3,925,780 | 12/1975 | Van Voorhis | 341/63 |
| 4,464,650 | 8/1984 | Eastman et al. | 341/51 |
| 4,494,108 | 1/1985 | Langdon, Jr. et al. | 341/51 |
| 4,545,032 | 10/1985 | Mak | 364/900 |
| 4,558,302 | 12/1985 | Welch | 341/51 |
| 4,570,056 | 2/1986 | Hanson | 341/67 |
| 4,612,532 | 9/1986 | Bacon et al. | 341/51 |
| 4,725,815 | 2/1988 | Mitchell et al. | 341/67 |
| 4,814,746 | 3/1989 | Miller et al. | 341/95 |
| 4,843,389 | 6/1989 | Lisle et al. | 341/106 |
| 4,870,415 | 9/1989 | Van Maren et al. | 341/51 X |
| 4,906,991 | 3/1990 | Fiala et al. | 341/51 |

Primary Examiner—A. D. Pellinen
Assistant Examiner—Howard L. Williams
Attorney, Agent, or Firm—Christie, Parker & Hale

[57] ABSTRACT

A method of compressing input characters, and decompressing compressed data to produce the original input characters is provided whereby an input substitution table and an output substitution table are formed by storing an identical set of arbitrary character tokens of a fixed length in each of the tables. Each table entry has a first and second token data field associated with it. The token data fields are representative of either a character token or substitution code token. Input characters are loaded into an input register and pairs of tokens in the input register are replaced with a substitution code token from the input substitution table. The tokens residing in the input resister are transmitted as output tokens to the decompression mechanism. The entries in the input substitution table are then updated by locating a substitution entry in the table which is not referenced by any other substitution table entry and by replacing this entry with the two most recently transmitted output tokens. Meanwhile, the transmitted output tokens are loaded into a token field of an output register. The output substitution table is updated based on the received output tokens in a manner similar to the method of updating the input substitution table. Substitution code tokens received by the output register are expanded to produce a plurality of character tokens. Character tokens are output as output characters which are identical to the original input characters.

9 Claims, 6 Drawing Sheets

DATA COMPRESSION METHOD USING TEXTUAL SUBSTITUTION

FIELD OF THE INVENTION

This invention relates generally to a method for compressing and decompressing digital data, and more particularly, to an adaptive method of compression and decompression which utilizes recursion.

BACKGROUND OF THE INVENTION

Data compression systems encode a stream of digital data signals into compressed digital code signals and decode the compressed code signals back into the original data. Typically, a data compression system is used to encode data for its transmission to a remote location whereby the compression of the data reduces the amount of data transmitted.

Data compression algorithms may be divided into various categories, based on the techniques employed and the intended application of the algorithm. Some algorithms require that all of the input data (or a large block of data) be present for analysis prior to the compression taking place. Other algorithms can accept an input stream of uncompressed data and generate an output stream of compressed data without the need to buffer large quantities of data.

Accordingly, the latter type of compression algorithm is ideally suited to modems and other data communications applications which operate on a serial data stream.

A desirable feature of a data compression system is adaptability. A system's adaptability depends on its ability to efficiently compress input data that varies over a range of conditions. A second desirable feature is the storing of character strings. Character strings in the input data which match known character strings may be represented in the transmission of data by a single token rather than the entire string of characters.

SUMMARY OF THE INVENTION

A presently preferred embodiment of the present invention provides a method of compressing input characters represented by digital data, and decompressing said compressed data to produce the original input characters An input substitution table and an output substitution table are formed by storing an identical set of arbitrary character tokens of a fixed length in each of the tables wherein each table entry has a unique identification and a first and second token data field associated with it. The token data fields are representative of either a character token or substitution code token.

Input characters are loaded into an input register, one at a time, while ensuring that at least two tokens are contained in the input register before attempting a data compression. Pairs of tokens in the input register are replaced with a substitution code token from the input substitution table when said substitution code represents a substitution table entry having a first and second token which match the tokens in the input register. Substitution is repeated until no more character pairs in the input register can be replaced by substitution code tokens.

All of the tokens residing in the input resister, except for the token most recently loaded or substituted for, are transmitted as output tokens to the decompression mechanism. The entries in the input substitution table are then updated by locating a substitution entry in the table which is not referenced by any other substitution table entry and then by replacing the first and second tokens of the located substitution table entry with the two most recently transmitted output tokens.

Meanwhile, the transmitted output tokens are loaded into a token field of an output register one at a time. The output substitution table is updated based on the received output tokens by locating a substitution entry which is not referenced by any other substitution table entry and by replacing the first and second tokens of the located substitution table entry with the two output tokens most recently received by the output register.

If the token most recently loaded into the output register is a substitution code token then it is expanded to its component character tokens according to the entries in the output substitution table. The character tokens hereby expanded, along with the tokens received by the output register as character tokens are output as output characters These output characters are identical to the input characters.

The steps loading the transmitted tokens, updating the output substitution table, expanding substitution code tokens and writing character tokens for each of the output tokens transmitted from the input register are repeated until each of the received output tokens are processed.

BRIEF DESCRIPTION OF THE DRAWINGS

These and other features and advantages of the present invention will be better understood by reference to the following detailed description when considered in connection with the accompanying drawings wherein.

DETAILED DESCRIPTION

Figure 1:
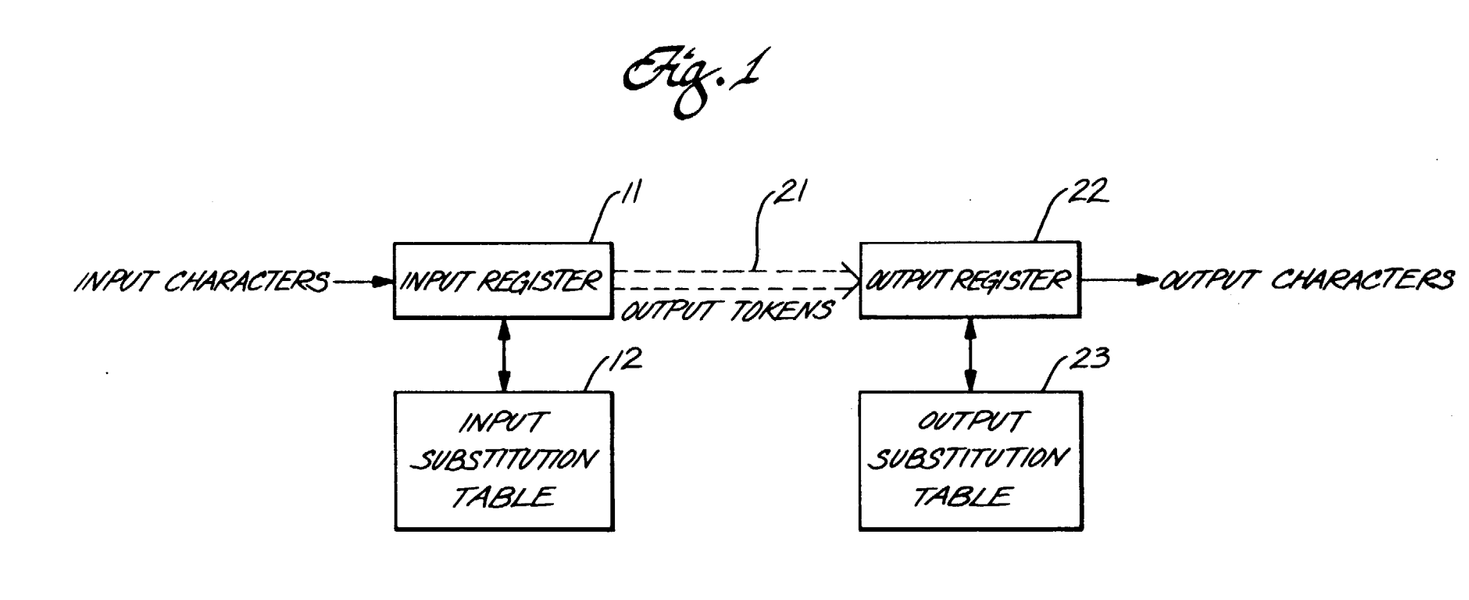
FIG. 1 is a block diagram illustrating the flow of data in the compression and decompression procedures.

Referring to FIG. 1, a block diagram illustrates the overall flow of data through the compression and decompression algorithms An input register 11 receives input characters in a serial fashion. That is, each input character is individually input into the input register. For the purposes of this disclosure, an input character is generally a binary data word which represents the particular character to be input. The binary data word may be of any size, and is not limited to seven-bit ASCII characters.

Figure 2:
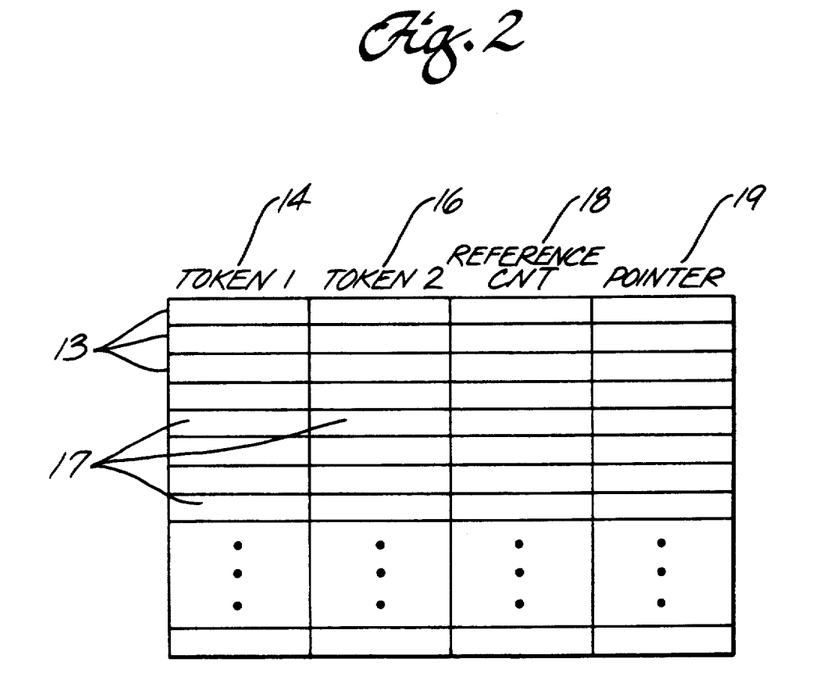
FIG. 2 is a block diagram illustrating the fields of an exemplary substitution table.

The contents of the input register are compressed according to the contents of a compression substitution table 12. The compression substitution table contains character strings which allow multiple input characters to be represented as a single token. FIG. 2 illustrates a simplified memory map for an exemplary compression substitution table.

As shown in FIG. 2, an exemplary substitution table contains a plurality of table entries 13, organized into columns of data. The first two columns contain tokens (designated as token1 14 and token2 16, wherein the content of each token field 17 may be either a character token or a substitution code (sub-code) token. A character token represents an individual character and a sub-code token represents a pair of tokens located elsewhere in the substitution table. In other words, a sub-code token uniquely identifies one of the substitution table entries and represents the two tokens placed in that table entry.

For example, assume that one substitution table entry contains two character tokens representing the characters "t" and "h". Assume further that a second table entry contains one sub-code token representing the table entry having "t" and "h" along with a character token representing the character "e". The second table entry represents the word "the". Further, if a third table entry contains a sub-code token representing the second table entry along with a character token representing the character "n", then this third table entry represents the word "then".

It is important to note that each entry in the substitution table may contain 1) two character tokens, 2) one character token and one sub-code token (each type of token located in either the first or second token position) or 3) two sub-code tokens. The flexibility of the substitution table not only allows additional characters to be added to the end of existing character strings, but also existing character strings to be added as a suffix to individual characters, other character strings or any combination of the above. For example, once the character string "for" is in the table, it may be used as part of the character strings "fort", "form" and "fork", as well as "before" and "afford".

The third column shown in FIG. 2 is the reference count 18. Each substitution table entry has associated with it a reference count which is used to make sure that no entry in the substitution table is replaced if that entry is being referenced by a sub-code token in another table entry. In the compression procedure described in detail below, only table entries having a reference count of zero can be changed. In the example cited above where the first table entry had tokens representing the characters "t" and "h" (and thus representing the character string "th"), the reference count for the first table entry was incremented as soon as other table entries were updated to reference the first table entry (such as the second table entry). If, on the other hand, the first table entry was allowed to be changed, to contain the characters "c" and "k" for example, then the dependant table entries would also change their meanings. The second table entry would have tokens which represent the character string "cke" rather than "the". The third table entry would have tokens which represent the character string "cken" rather than "then".

The fourth column of data contains a pointer mechanism 19. The pointer mechanism uniquely identifies each substitution table entry and has the capability of monitoring the frequency with which each table entry is being used by the compression algorithm. In other words, the pointer mechanism keeps track of the entries in the substitution table in a most recently used to least recently used order. Table entries that are the least recently used are updated first. The pointer mechanism may be implemented in a variety of ways, and as such is not limited to one data field per table entry as shown in FIG. 2.

Returning now to the general description of the compression and decompression procedure, pairs of characters in the input data stream are replaced by a single substitution code token which represents the entry in the substitution table containing the characters being replaced Substitution is attempted repeatedly, and pairs of substitution table tokens are replaced by a single substitution code until no more substitutions can be made. The characters and substitution code tokens in the input register are then transmitted as output tokens on a transmission medium 21.

Concurrently, new entries are being made in the substitution table according to the substitutions previously made. New entries replace old entries in the substitution table which have not been used in a while. These new entries will allow previously uncompressible character strings to be compressible if they appear again in the input data stream.

Once the table update procedure has been completed, more input characters are loaded into the input register according to the compression procedure described above.

Meanwhile, the output tokens on line 21 are received by an output register 22 which is, in turn, coupled to an output substitution table 23. The output substitution table contains entries which are identical to the entries originally in the input substitution table. Each sub-code token received by the output register is replaced by the pair of tokens from the output substitution table it represents. Again, these tokens may be either characters tokens or sub-code tokens. Substitution code tokens are repeatedly replaced by pairs of tokens from the substitution table until only character tokens remain. The character tokens are output as the output characters (which are identical to the original input characters).

In order to properly decode the transmitted code tokens, the output substitution table must be updated in exactly the same way as the input substitution table. Thus, new entries are made in the output substitution table which are based entirely on the received output tokens.

It is crucial that while the decompression algorithm is expanding data in a particular point in the data stream, the contents of the output substitution table be exactly the same as the contents of the input substitution table were when the compression algorithm was compressing the same point in the data stream.

Figure 3:
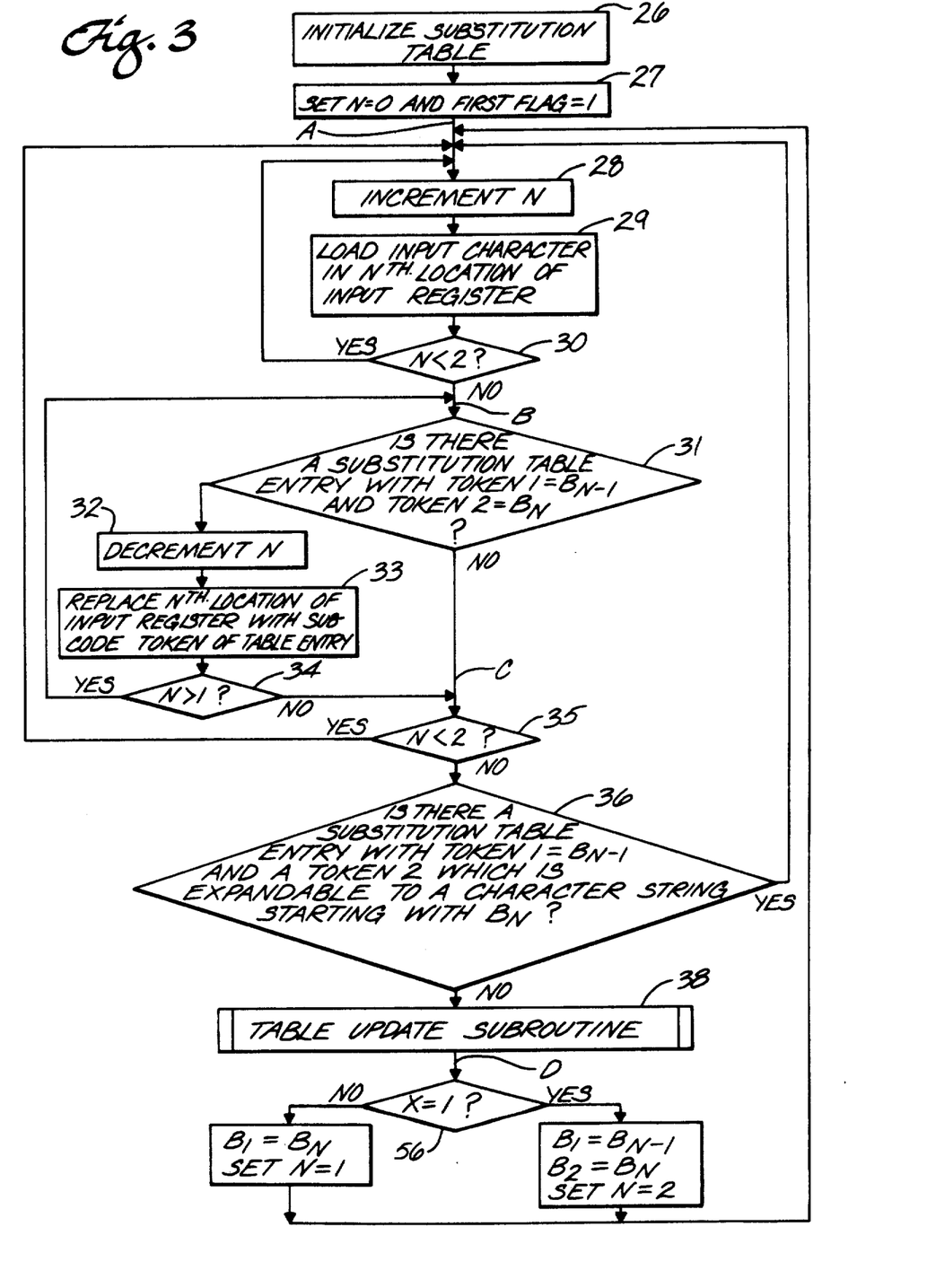
FIG. 3 illustrates the compression procedure flow chart.

FIG. 3 shows, in detail, the procedure used for compressing input characters The compression procedure begins with the step shown in box 26 wherein the input substitution table is initialized so that the table entries contain predetermined values. The actual values are not important, however the values must be known so that the output substitution table can be initialized to the same values. The tokens in each table entry may contain any character token as long as the initial state of the input substitution table is known. The reference count for each table entry is initialized to zero.

The compression procedure continues with the step shown in box 27 wherein an integer variable, N, is set to zero and a flag (first flag) is set to a one. The variable N indicates how many memory locations in the input register are filled with either character tokens or sub-code tokens. First flag is a decisional flag used by the substitution table update procedure as described below.

The next step in the compression procedure is shown in box 28 wherein N is incremented by one. In the following step, shown in box 29, an input character is stored in the Nth location ($B_n$) of the input register. At this point in the procedure, according to decisional box 30, if N is less than two, then the portion of the procedure beginning at intermediate point A is repeated. For example if N is equal to one, then N is incremented (to two) and an input character is stored in the Nth location of the input register Note that the previously stored input character now resides in the (N−1)th location ($B_{n-1}$) of the input register.

This loop in the compression procedure, shown in the flow chart between box 30 and intermediate point A is required to ensure that there are at least two tokens in the input register. This follows from the simple fact that the input register must have at least two tokens in order for the contents of the input register to be compressible.

Continuing with the compression procedure, as shown in box 31, if there is an entry in the input substitution table wherein token1 equals the token in the (N−1)th location of the input register and token2 equals the token in the Nth location of the input register, then N is decremented, according to box 32, and the contents of the Nth location of the input register is replaced with the sub-code token which represents the substitution table entry identified in box 31. For example, if N equals two, and the contents of the first location of the input register is "s", the contents of the second location of the input register is "o" and there is a table entry having token1 and token2 equal to "s" and "o" respectively, then N is decremented to equal one, according to box 32 of the flow chart, and the sub-code token representing the identified table entry is loaded into the first location of the input register (the second location of the register is now blank).

Returning to the compression procedure, if N is greater than one, then the procedure returns to intermediate point B. If N is not greater than 1, then the procedure continues to intermediate point C. Also, if the input substitution table does not contain an entry which satisfies the question in box 31, then the procedure continues to intermediate point C, bypassing boxes 32, 33 and 34.

Continuing with the compression procedure, immediately following intermediate point C at decisional box 35, if N is no longer equal to or greater than two, the procedure returns to intermediate point A in order to load another input character into the input register. If, however, N is equal or greater than two, the procedure continues to decisional box 36. Accordingly, if there is an entry in the input substitution table which has a token1 equal to the contents of the (N−1)th location of the input register and a token2 which will expand, through any number of substitutions, to a character string beginning with the contents of the Nth location of the input register, then the portion of the compression procedure beginning at intermediate step A is repeated.

Token2 will expand to a string beginning with a particular token if it is a sub-code token and it represents a tree structure of referenced substitution table entries wherein the first node of the tree is a table entry having token1 equal to the designated token. For example, assume a first table entry (Entry1) having a token1 representing "e" and a token2 representing "f" and a second table entry (Entry2) having a token1 representing "d" and a token2 representing Entry1 (i.e., a sub-code token identifying the first table entry). If the input register has in its first two locations the characters "d" and "e" respectively, then the second table entry (Entry2) has a token1 which equals the (N−1)th location in the input register and a token2 which is expandable to a character string starting with the character "e".

If there is no substitution table entry as defined in box 37 then no more compression can be done on the input characters that have been stored in the input register, and the compression procedure is interrupted by the table update subroutine indicated in box 38. At this point in the compression procedure, the input register contains at least two tokens. Each of the tokens may be either a character token or sub-code token. The contents of the first through (N−1)th location of the input register are output, one at a time, as output tokens on transmission medium 21 according to the table update routine described in detail below.

Figure 4:
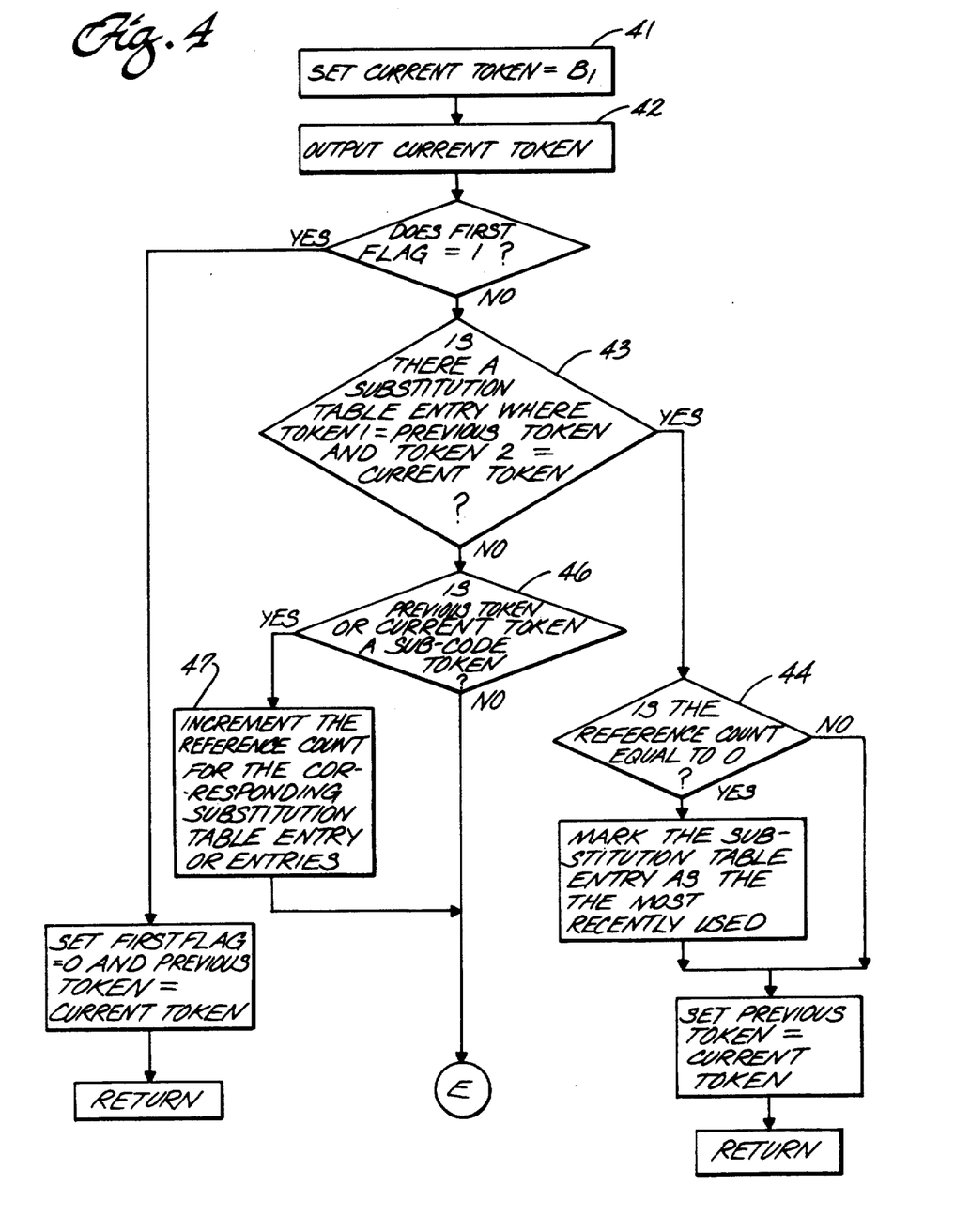
FIG. 4 illustrates the substitution table update routine flow chart.

The table update routine begins with the steps shown in box 41 shown in FIG. 4 wherein a binary variable "current token" is set to equal the token in the first location of the input register and a flag "X" is set to zero. The following step, shown in box 42, is to transmit "current token" as an output token on transmission medium 21. If "first flag" is still set to one (it was set during the compression procedure according to box 27) then "first flag" is set to zero, a binary variable "previous token" is set to equal "current token" and the procedure returns to intermediate point D in the compression procedure or to the beginning of the table output routine if there more than two tokens in the input register available for output (i.e., if there are more than two tokens in the input register).

In other words, no table update is performed upon the output of the first token in the input register However, the output token is saved (in the variable previous token) for use in updating the substitution table the next time through the table update routine.

Returning now to the table update subroutine, if "first flag" no longer equals one, then the table update procedure continues to box 43. Accordingly, if there is an entry in the substitution table wherein token1 equals "previous token" and token2 equals "current token", then the table update routine flows to box 44. According to box 44, if the reference count for the substitution table entry found according to the box 43 is zero then that substitution table entry is to be marked as the most recently used entry. Regardless of whether the reference count is zero for the above identified substitution table entry (i.e., the entry found in decisional box 43), "previous token" is set equal to "current token" and the routine returns to intermediate point D in the compression procedure.

However, if no entry is found in the substitution table according to box 43, then the table update proceeds to box 36, wherein if either "previous token" or "current token" is a sub-code token, then the reference count for the corresponding substitution table entries are incremented by one according to box 47 of the flow chart. Incrementing the reference count of the table entries protects those entries from being updated, at least until the reference are decremented once again. This is an important step since the tokens about to be recorded together ("previous token" and "current token") in a new table entry may reference other table entries. Incrementing the reference count of the referenced entries ensures that the contents of the referenced entries are not changed as long as there are table entries dependant upon them.

Returning to the table update routine, regardless of whether "previous token" or "current token" is a sub-code token, the table update routine continues to intermediate point E.

Point E in the table substitution routine represents the point where a new table entry is to be written in the substitution table. Accordingly box 48 probes whether there are any entries in the substitution table that have a reference count of zero. If no entries are found with a reference count of zero, then the routine continues to box 49. If either the "previous token" or "current token" is a sub-code token then the reference count for the corresponding table entries is decremented by one. If the corresponding table entries have a reference count of zero, then the entries are marked as the most recently used. Regardless of the outcome of the decision in box 49, "previous token" is set to equal "current token", and the routine returns to the compression procedure. Note that if no substitution table entries with a reference count of zero are found, then the substitution table is not updated.

Returning however to box 48, if a substitution table entry is found with a reference count of zero, then the routine proceeds to box 51 wherein it is asked whether token1 or token2 is a sub-code token. If either is a sub-(code token, then the reference count for the corresponding table entries is decremented. If the corresponding table entries have a reference count of zero, then each entry is marked as most recently used. Regardless of whether either of the tokens is a sub-code token, the routine proceeds to box 53.

Box 53 determines whether the contents of the Nth location of the input register is the sub-code for the table entry identified in box 48. If so, then flag "X" is set to one, token1 of the identified table entry is loaded into the Nth location of the input register and token2 of the identified table entry is loaded into the (N+1)th location of the input register according to box 54 of FIG. 4 (Flag "X" is used by the compression procedure to correctly set the contents of the input register). The purpose of these steps is to "un-do" the last data compression performed by the compression procedure. This is necessary since the sub-code token in the Nth location of the input buffer references a table entry that was just updated by the table update routine.

Regardless of the outcome of the decision in box 53, the table entry identified in box 48 is updated with "previous token" and "current token" whereby the former is loaded into the token1 data field and the latter is loaded into the token2 data field. The table update routine subsequently returns to the compression procedure.

Upon return from the table update routine, the compression procedure continues to decisional box 56 where it is asked whether the flag "X" has been set to a one. If it has not been set to a one, then the contents of the Nth location of the input buffer is moved to the first location and N is set to one. If, on the other hand, the flag "X" has been set to one, then the token in the (N−1)th location of the input register is moved to the first location, the token in the Nth location is moved to the second location and N is set to two. Once the contents of the input register has been adjusted the compression procedure returns to intermediate point A.

Figure 5:
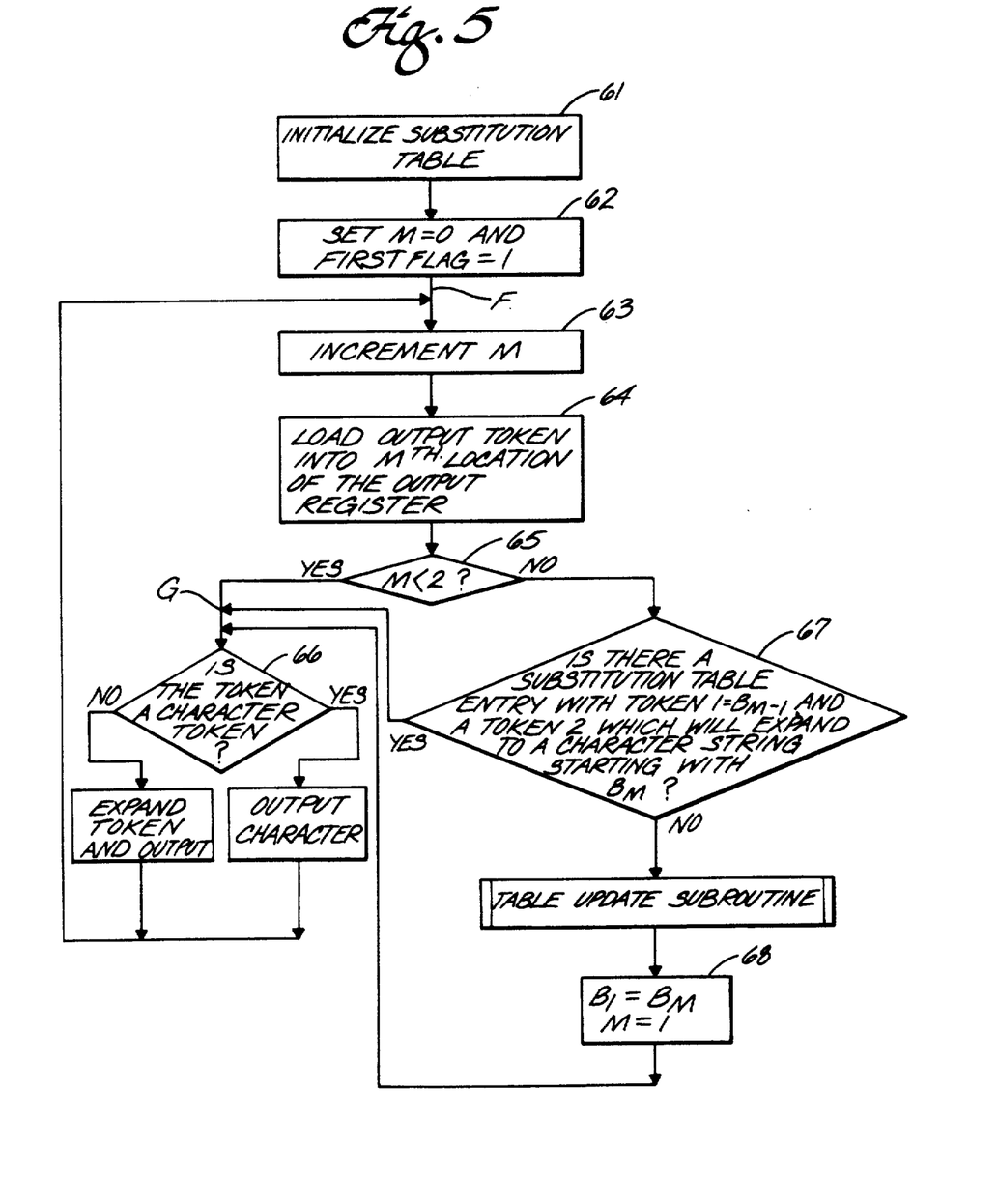
FIG. 5 illustrates the decompression routine flow chart.

FIG. 5 shows, in detail, the procedure used for decompressing the transmitted output tokens. The decompression procedure begins with the step shown in box 61 wherein the output substitution table is initialized to the same predetermined values that the input substitution table was initialized to. The decompression procedure continues with the step shown in box 62 wherein an integer variable, M, is set to zero and a flag (first flag) is set to one. The variable M indicates how many memory locations in the output register are filled with tokens. First flag is a decisional flag used by the output substitution table update procedure.

The next step in the decompression procedure is shown in box 63 wherein M is incremented by one. In the following step, shown in box 64, an output token is loaded into the Mth location of the output register. At this point in the procedure, if M is less than two (according to decisional box 65), then the decompression procedure continues to intermediate point G. According to decisional box 66, if the token currently in the Mth location of the output register is a character token, then the token is output as an output character. If, however, the token in the Mth location of the output register is a sub-code token, then the token is expanded by replacing in with the tokens in the corresponding table entry in the output substitution table. This expansion is repeated until each of the sub-code tokens which replace previously expanded tokens are expanded to character tokens.

It is important to note that although the character tokens are output as output characters, the original character token or un-expanded sub-code token that was resident in the output register remains in the register. After the appropriate tokens are output, the decompression procedure returns to intermediate point F.

If M is not less than two when the decisional box 65 is reached, then the procedure continues to decisional box 67. If there is a substitution table entry with a token1 matching the token in the (M−1)th location in the output register and a token2 matching a sub-code token which will expand, through any number of substitutions, to a character string beginning with the token in the Mth location of the output register, then the procedure continues to intermediate point G. On the other hand, if the condition in box 67 is not met, then it is known that there are at least two tokens in the output register, and the output substitution table is to be updated based on the contents of the output register. The output substitution table update routine is performed on each of the tokens 1 through M−1 in the output register.

The output table update routine is the same as the update routine for the input substitution table with one minor exception In the table update routine for the output substitution table the steps shown in boxes 53 and 54 are not required Upon completion of the table update routine, the token in the Mth location of the output register is moved to the first location of the output register, M is reset to one, and the decompression procedure continues to intermediate point G.

It is apparent that in the compression procedure as described above, the last input character in the message to be transmitted is never output by the compression procedure as an output token. In an exemplary embodiment of the present invention, this is overcome by flushing the input register of all tokens each time the input register has to wait for new input characters for a predetermined period of time. When the input register is flushed in this manner, all of the tokens are used to perform table substitution according to the table update routine as disclosed. Synchronization between the input substitution table and the output substitution table is maintained by using a third type of output token in the compression procedure A special token, called a flush flag is output immediately following the flush of the input register. When the output register receives the flush flag, the decompression procedure ensures that all of the tokens in the output register are flushed and the table update routine is performed on all of the flushed tokens. The flush flag itself is never included in the updated input or output substitution tables.

A specific embodiment of the present invention is disclosed in Appendix A, the contents of which are incorporated by reference herein. Appendix A discloses two C language programs, one of which implements the compression procedure, and the other implements the decompression procedure.

The preceding description has been presented with reference to the presently preferred embodiment to the invention shown in the drawings. Those skilled in the art and technology to which this invention pertains will appreciate that alterations and changes in the described structures can be practiced without departing from the spirit, principles and scope of this invention.

What is claimed is:

1. A data compression and decompression method for compressing digital data and recovering the original data from the compressed data comprising the steps of:
   (a) parsing a stream of input character symbols, wherein said parsing step comprises the steps of:
      (i) defining two identical search trees, an input search tree and an output search tree, each tree having a plurality of nodes and branches associated with each node, each node having a plurality of incoming branches and a plurality of outgoing branches, each node being representative of any combination of character symbols or node symbols, wherein a node symbol is a parsed character stream having a plurality of individual character symbols;
      (ii) tracing said stream of input data symbols through input search tree by substituting consecutive characters symbols with a single node symbol from the input search tree representative of the substituted characters symbols;
      (iii) tracing said stream of input character symbols through the input search tree by substituting combinations of a character and a node symbol with a single node symbol from the input search tree;
      (iv) tracing said stream of input character symbols through the input search tree by substituting combinations of two node symbols with a single node symbol from the input search tree;
   (b) transmitting unparsed characters;
   (c) transmitting parsed input data symbols in the form of node symbols;
   (d) replacing node symbols in the input search tree with new node symbols representative of substitutions made in the tracing steps;
   (e) receiving the transmitted character and node symbols;
   (f) expanding the received node symbols wherein the expanding step comprises the steps of:
      (i) tracing the received node symbols through the output search tree;
      (ii) substituting for each received node symbol the node or character symbols the received node symbol is representative of according to the output search tree; and
   (g) repeating the expanding step until the original received node symbol is expanded to only character symbols;
   (h) replacing node symbols in the output search tree with new node symbols representative of substitutions made in the expanding step; and
   (i) returning to the parsing step to input new character symbols.

2. A method for compressing input characters and for decompressing the compressed characters comprising the steps of:
   (a) storing an identical set of arbitrary character tokens of a fixed length in each of an input substitution table and an output substitution table wherein each table entry has a unique identification and a first and second token data field associated with it, said token data fields being representative of either a character token or substitution code token;
   (b) loading an input character token into a token field in an input register, wherein each token field in the input register may contain data representative of either a character token or a substitution code token;
   (c) ensuring that at least two tokens are contained in the input register by repeating the step whereby an input character is loaded into the input register;
   (d) substituting pairs of tokens in the input register with a substitution code token from the input substitution table when said substitution code represents a substitution table entry having a first and second token which match the tokens in the input register;
   (e) repeating the step of ensuring that at least two tokens are contained in the input register and the step of substituting token pairs until no more token pairs in the input register can be replaced by substitution code tokens;
   (f) transmitting all of the tokens contained in the input register, except for the one most recently loaded or substituted for;
   (g) updating the input substitution table;
   (h) loading one of the transmitted tokens into a token field of the output register, wherein each token field in the output register may contain data representative of either a character token or a substitution code token;
   (i) updating the output substitution table;
   (j) if the token most recently loaded into the output register is a substitution code token then expanding the token to its component character tokens according to the entries in the output substitution table;
   (k) writing the resultant character tokens from the output register;
   (l) repeating the steps loading the transmitted tokens, updating the output substitution table, expanding substitution code tokens and writing character tokens for each of the output tokens transmitted from the input register.

3. A method as recited in claim 2 wherein the step of updating the input substitution table comprises the steps of:
   (a) locating a substitution entry which is not referenced by any other substitution table entry;
   (b) replacing the first and second tokens of the located substitution table entry with the two most recently transmitted output tokens.

4. A method as recited in claim 3 wherein the step of updating the output substitution table comprises the steps of:
   (a) locating a substitution entry which is not referenced by any other substitution table entry;
   (b) replacing the first and second tokens of the located substitution table entry with the two output tokens most recently received by the output register.

5. A method for compressing and decompressing data comprising the steps of:
(a) initializing an input and an output substitution table by storing identical sets of arbitrary character tokens of fixed length in each of the substitution tables, each table entry in each of the substitution tables having a unique identification and a first and second token data field associated with it, said token data fields capable of containing data which is representative of a character token or a substitution code token;
(b) setting a variable "N" equal to zero;
(c) setting a variable "input first flag" equal to one;
(d) incrementing N;
(e) loading an input character into the Nth memory location of an input register;
(f) deciding whether N is less than two;
(g) returning to the step incrementing N if N is less than two;
(h) locating an actual match in the input substitution table, an actual match being a substitution table entry having a first token matching the token in the (N−1)th memory location of the input register and a second token matching the token in the Nth memory location of the input register;
(i) decrementing N;
(j) replacing the contents of the Nth location of the input register with the substitution code token corresponding to the substitution table entry found in the locating step;
(k) repeating the locating, decrementing and replacing steps for each substitution table entry located having tokens which match the tokens in the (N−1)th and Nth memory locations in the input register;
(l) repeating the steps of deciding whether N is less than two and returning to the step incrementing N is N is less than two;
(m) locating a potential match in the input substitution table, a potential match being a substitution table entry having a first token matching the token in the (N−1)th memory location of the input register and a second token which is expandable, using any combination of entries in the substitution table, to a character string starting with the token in the Nth memory location of the input register;
(n) returning to the step incrementing N if a potential match is located;
(o) outputting all of the tokens in the input register, except for the token in the Nth location, one at a time beginning with the token in the first location of the input register;
(p) updating the input substitution table by replacing tokens in the data fields of selected input substitution table entries;
(q) resetting the contents of the input register;
(r) setting a variable "M" equal to zero;
(s) setting a variable "output first flag" equal to one;
(t) incrementing M;
(u) loading an output token into the Mth location of the output register;
(v) deciding if M is less than two;
(w) if M is less than two then:
(i) deciding if the token in the Mth location of the output register is a character token or a sub-code token;
(ii) if the token in the Mth location of the output register is a sub-code token, then expanding the token to produce a plurality of character tokens;
(iii) outputting the character tokens as output characters;
(iv) returning to the step incrementing M;
(x) if M is not less than two then:
(i) locating a potential match in the output substitution table, a potential match being a substitution table entry having a first token matching the token in the (M−l)th memory location of the input register and a second token which is expandable, using any combination of entries in the substitution table, to a character string starting with the token in the Mth memory location of the input register;
(ii) updating the output substitution table by replacing tokens in the data fields of selected output substitution table entries if there is no potential match;
(iii) placing the token in the Mth memory location of the output register in the first location of the output register;
(iv) setting M equal to one;
(v) returning to the step deciding whether the token in the output register is a character token or a sub-code token;
(vi) returning to the step deciding whether the token in the output register is a character token or a sub-code token.

6. A method as recited in claim 5 wherein the step updating the input substitution table comprises the steps
(a) setting the current token to equal the token in the first memory location of the input register;
(b) deciding whether first flag equals one;
(c) if first flag equals one, then:
(i) setting previous token equal to current token if first flag equals one;
(ii) setting first flag equal to zero;
(iii) returning to the step setting the contents of the input register;
(d) repeating the step deciding whether there is an actual match in the input substitution table;
(e) if there is an actual match, then:
(i) marking the matching substitution table entry as the most recently used if the reference count corresponding to the substitution table entry is zero;
(ii) repeating the step setting previous token equal to current token;
(iii) repeating the step returning to the step setting the contents of the input register;
(f) if there is no actual match, then deciding whether either the previous token or the current token is a substitution code token;
(g) incrementing the reference count of each substitution table entry which corresponds to either previous token or current token if either are substitution code tokens;
(h) deciding whether there is a substitution table entry having a reference count of zero;
(i) if there is a substitution table entry having a reference count of zero, then:
(i) repeating the step deciding whether previous token or current token is a substitution code token;
(ii) if previous token or current token is a substitution code token, then decrementing the reference count for each corresponding substitution table entry;

(iii) if the previous token or current token is a substitution code token and after decrementing the relevant reference counts, the reference count is zero, then marking the reference counts as the most recently used;

(iv) repeating the step setting previous token equal to current token;

(v) repeating the step returning to the step setting the contents of the input register;

(j) if there is a substitution table entry having a reference count of zero, then:

(i) deciding whether the first token or the second token in the located substitution table entry is a substitution code token;

(ii) decrementing the reference count for each substitution table entry corresponding to the substitution code tokens in the substitution table entry located as having a reference count of zero;

(iii) if the reference count is equal to zero, then marking the substitution table entry as the most recently used;

(iv) deciding whether the token in the Nth location of the input register is the substitution code token for the substitution table entry located as having a reference count of zero;

(v) if the token in the Nth location of the input register is the substitution code token for the substitution table entry located as having a reference count of zero, then storing the first token of the located substitution table entry in the Nth location of the input register and storing the second token of the located substitution table entry in the (N+1)th location of the input register;

(vi) setting the first token in the located substitution table entry equal to previous token;

(vii) setting the second token in the located substitution table entry equal to current token;

(viii) repeating the step marking the located substitution table entry as the most recently used;

(ix) repeating the step returning to the step setting the contents of the input register.

7. A method as recited in claim 6 wherein the step updating the output substitution table comprises the steps of:

(a) setting the current token to equal the token in the first memory location of the input register;

(b) deciding whether first flag equals one;

(c) if first flag equals one, then:

(i) setting previous token equal to current token if first flag equals one;

(ii) setting first flag equal to zero;

(iii) returning to the step setting the contents of the input register;

(d) repeating the step deciding whether there is an actual match in the input substitution table;

(e) if there is an actual match, then:

(i) marking the matching substitution table entry as the most recently used if the reference count corresponding to the substitution table entry is zero;

(ii) repeating the step setting previous token equal to current token;

(iii) repeating the step returning to the step setting the contents of the input register;

(f) if there is no actual match, then deciding whether either the previous token or the current token is a substitution code token;

(g) incrementing the reference count of each substitution table entry which corresponds to either previous token or current token if either are substitution code tokens;

(h) deciding whether there is a substitution table entry having a reference count of zero;

(i) if there is a substitution table entry having a reference count of zero, then:

(i) repeating the step deciding whether previous token or current token is a substitution code token;

(ii) if previous token of current token is a substitution code token, then decrementing the reference count for each corresponding substitution table entry;

(iii) if the previous token or current token is a substitution code token and after decrementing the relevant reference counts, the reference count is zero, then marking the corresponding substitution table entry as the most recently used;

(iv) repeating the step setting previous token equal to current token;

(v) repeating the step returning to the step setting the contents of the input register;

(j) if there is a substitution table entry having a reference count of zero, then:

(i) deciding whether the first token or the second token in the located substitution table entry is a substitution code token;

(ii) decrementing the reference count for each substitution table entry corresponding to the substitution code tokens in the substitution table entry located as having a reference count of zero;

(iii) if the reference count is equal to zero, then marking the substitution table entry as the most recently used;

(iv) setting the first token in the located substitution table entry equal to previous token;

(v) setting the second token in the located substitution table entry equal to current token;

(vi) repeating the step marking the located substitution table entry as the most recently used;

(vii) repeating the step returning to the step setting the contents of the input register.

8. A method as recited in claim 7 whereby the step of resetting the contents of the input register comprises the steps of:

(a) replacing the contents of the first location of the input register with the contents of the Nth location of the input register; and (b) repeating the step whereby N is set to one.

9. A method as recited in claim 8 whereby the step of resetting the contents of the input register comprises the steps of replacing the contents of the first location of the input register with the contents of the (N−1)th location of the input register, replacing the contents of the second location of the input register with the contents of the Nth location of the input register and setting N equal to two if the Nth token in the input register was replaced with two tokens in the step whereby input substitution table is updated.

* * * * *